(12) United States Patent
Mennecart et al.

(10) Patent No.: US 7,849,279 B2
(45) Date of Patent: Dec. 7, 2010

(54) METHOD FOR THE SECURE UPDATING DATA AREAS IN NON VOLATILE MEMORY, DEVICE TO PERFORM SUCH A METHOD

(75) Inventors: José Mennecart, Dry (FR); Stéphane Grellier, Isdes (FR)

(73) Assignee: Gemalto SA, Meudon (FR)

( * ) Notice: Subject to any disclaimer, the term of this patent is extended or adjusted under 35 U.S.C. 154(b) by 1727 days.

(21) Appl. No.: 10/450,872

(22) PCT Filed: Dec. 18, 2001

(86) PCT No.: PCT/IB01/02554
§ 371 (c)(1), (2), (4) Date: Nov. 14, 2003

(87) PCT Pub. No.: WO02/50844
PCT Pub. Date: Jun. 27, 2002

(65) Prior Publication Data
US 2004/0073744 A1  Apr. 15, 2004

(30) Foreign Application Priority Data
Dec. 18, 2000 (FR) .................................. 00 16816

(51) Int. Cl.
*G06F 12/06* (2006.01)

(52) U.S. Cl. ...................................... 711/162; 711/103
(58) Field of Classification Search ................. 707/200, 707/202, 201; 710/57; 711/118, 162, 103; 714/5; 718/101; 235/379; 365/229
See application file for complete search history.

(56) References Cited

U.S. PATENT DOCUMENTS
4,051,461 A * 9/1977 Hashimoto et al. .......... 711/118
(Continued)

FOREIGN PATENT DOCUMENTS
WO     WO 9625743 A1 *   8/1996
(Continued)

OTHER PUBLICATIONS
"Atmel Flash Programmable Erasable Rom, Application Note AN-1" Rev. 0572A-Oct. 1998.*

*Primary Examiner*—Pierre-Michel Bataille
(74) *Attorney, Agent, or Firm*—Pehr B. Jansson; The Jansson Firm

(57) ABSTRACT

For securing the data areas of a memory in an electronic component, said component is able to modify said data areas. A method includes a single backup memory of data areas including means of reference of the data to be secured, and means of backing up information on said data areas.

10 Claims, 2 Drawing Sheets

U.S. PATENT DOCUMENTS

| | | | | |
|---|---|---|---|---|
| 4,159,517 | A | * | 6/1979 | Paradine et al. ............... 710/57 |
| 4,321,667 | A | * | 3/1982 | Robbins et al. ................. 714/5 |
| 4,327,410 | A | * | 4/1982 | Patel et al. ................... 711/162 |
| 4,507,751 | A | * | 3/1985 | Gawlick et al. ............. 707/202 |
| 4,740,969 | A | * | 4/1988 | Fremont ...................... 714/15 |
| 4,864,109 | A | * | 9/1989 | Minematsu et al. ......... 235/379 |
| 4,959,774 | A | * | 9/1990 | Davis ............................ 714/6 |
| 5,086,502 | A | * | 2/1992 | Malcolm ....................... 714/8 |
| 5,109,505 | A | * | 4/1992 | Kihara .......................... 714/5 |
| 5,140,689 | A | * | 8/1992 | Kobayashi ................... 714/20 |
| 5,220,665 | A | * | 6/1993 | Coyle et al. ................. 718/101 |
| 5,325,519 | A | * | 6/1994 | Long et al. ................... 714/15 |
| 5,383,204 | A | * | 1/1995 | Gibbs et al. ................. 714/758 |
| 5,471,518 | A | * | 11/1995 | Barber et al. ............ 455/550.1 |
| 5,519,663 | A | * | 5/1996 | Harper et al. ................ 365/229 |
| 5,568,639 | A | * | 10/1996 | Wilcox et al. ............... 707/200 |
| 5,796,934 | A | * | 8/1998 | Bhanot et al. .................. 714/4 |
| 5,987,563 | A | * | 11/1999 | Itoh et al. .................... 711/103 |
| 7,694,091 | B2 | * | 4/2010 | Andrewartha et al. ....... 711/162 |
| 2002/0026566 | A1 | * | 2/2002 | Awada et al. ................ 711/162 |

FOREIGN PATENT DOCUMENTS

WO      WO 9843248 A1 * 10/1998

* cited by examiner

METHOD FOR THE SECURE UPDATING DATA AREAS IN NON VOLATILE MEMORY, DEVICE TO PERFORM SUCH A METHOD

FIELD OF THE INVENTION

This invention concerns a method for the secure updating of a plurality of data areas contained in a non-volatile memory. The invention takes into consideration in particular the case in which the plurality of data areas need to be updated together. It can be the case for example for a financial transaction wherein a first data area namely includes the amount of the transaction and a second data area contains the number of the transaction made. Said plurality of data areas needed to be updated together are also named indissociable data areas. This invention also concerns a device designed to perform such a method. Such a device can be, for example, an electronic component being able to modify a plurality of data areas in particular an electronic memory card or an integrated circuit card.

BACKGROUND OF THE INVENTION

Generally, the above-mentioned electronic memory cards use EEPROM or flash EPROM type memories which have the double advantage of being non volatile and electrically erasable, therefore rewritable. However, in some applications, these memories may be corrupted due to, in particular, an accidental interruption of the power supply during operation, leading to the loss of earlier data areas without writing new data in the said data areas.

This risk is especially important in the applications, such as the electronic memory cards, where the said memory is embedded in an object which depends on an external power source from which it may be separated at any time by withdrawal, deliberate or not.

The international patent application published under the number WO 97/25743 concerns a method for the secure updating of an EEPROM memory. In order to prevent the loss of sensitive data, for example if a power cut occurs during the updating, a method is provided, which includes saving the data to be updated in a backup region, programming a descriptor field for said region erasing the descriptor field for the following region of the back up memory, enabling an indicator corresponding to the back up region, updating the data, and disabling the indicator if the operation has been successful. The backup region is different every time. It is defined by scanning the backup memory and identified as the first region of the backup memory having an erased indicator. When the power supply is restored, the presence of an enabled indicator is systematically checked for, and the data saved in the corresponding regions are sent back to the main memory.

SUMMARY OF THE INVENTION

One purpose of the invention is to propose a method for the secure updating of data areas which is more efficient.

According to an aspect of the invention, a method for updating together a plurality of data areas contained in a non volatile memory (EEPROM) of an electronic component, said electronic component also including a volatile memory and a non volatile backup memory comprising for each data area:
  first means of reference;
  second means of backing up information;
is characterized in that it includes the following steps:
  a referencing step in which a reference is attributed to a data area in the volatile memory;
  a first copying step in which said data area and related data used to characterize said data area are copied from the non volatile memory to the volatile memory;
  a second copying step in which the entire content of the volatile backup memory is copied into the non volatile backup memory;
  an updating step in which the content of the data area stored in the non volatile memory of the electronic component is updated;
  if there is an other data area to update together, return to the referencing step in which a next data area is referenced;
  if not the non volatile backup memory is disabled.

According to an other aspect of the invention, a method for backing up at least one data area contained in a non volatile memory of an electronic component, said electronic component comprising a volatile memory and a non volatile backup memory, is characterized in that it includes the following steps:
  a first copying step in which said data area as well as related data used to characterise said data area are copied from the non volatile memory to the volatile memory;
  a second copying step in which the entire content of the volatile backup memory is copied into the non volatile backup memory.

According to an other aspect of the invention, a method for restoring together a plurality of data areas, said data areas being restored in a non volatile memory of an electronic component and being modifiable by said electronic component, said electronic component comprising a non volatile backup memory, said non volatile back up memory comprising for each data area:
  first means of reference; and
  second means of backing up information, said second means of backing up information comprising related data used to characterize said data area;

the method being characterized in that the method comprises the following steps:
  (a) a checking step in which a first means of reference of a data area is checked, said first means of reference is either disabled or not;
  (b) if said first means of reference is not disabled:
    (b1) a copying step in which the data area is copied from the non volatile backup memory into the non volatile memory; and
    (b2) if there is an other data area to be restored together, return to the checking step to check the next first means of reference of said other data area;
  (c) if the first means of reference is disabled, an disabling step in which the non volatile backup memory is disabled.

The invention takes the following aspects into consideration. A write access takes more time for a non-volatile memory than for a volatile memory. In a first copying step a data area and related data used to characterize said data area are copied from the non-volatile memory to the volatile memory. In this way, all the above-mentioned data are first gathered in the volatile memory so that they can be copied in the non-volatile memory in a single second copying step. Thus the number of write access to the non-volatile memory is reduced. By reducing the global time to write in a non-volatile, the lifetime of the non-volatile memory is increased and the methods according to the invention can be performed faster. The performance of the electronic component, for example an integrated circuit card, is thus improved. Consequently the method for the secure updating of data areas, the method for backing up at least one data area, and the method for restoring together a plurality of data area are more efficient.

These and other aspects of the invention will be described in greater detail hereinafter with reference to drawings.

DETAILED DESCRIPTION

Figure 1:
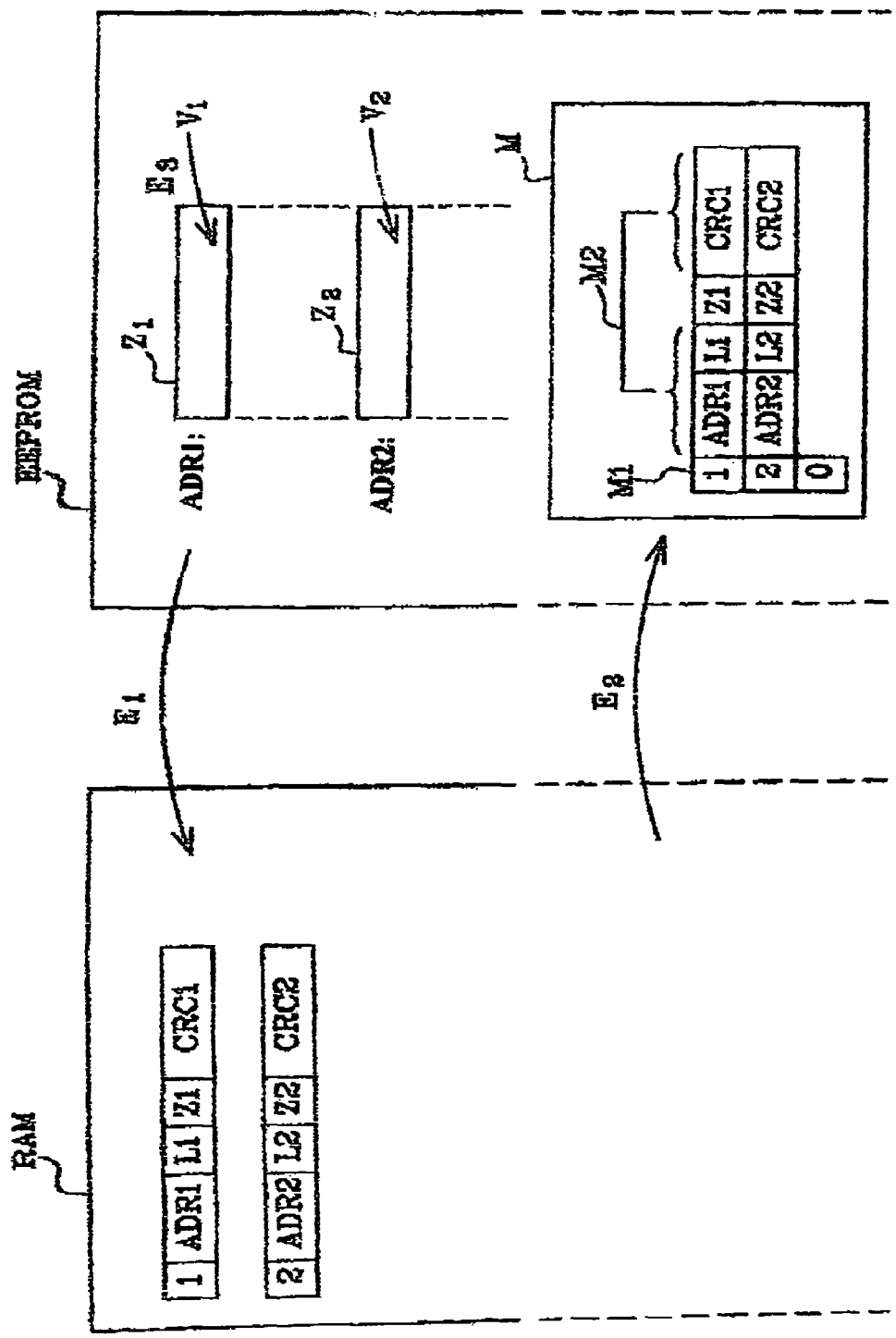
FIG. 1 is a diagrammatic representation of data areas of an electronic component secured using the device according to the invention.

As shown in the drawings for purposes of illustration, the invention is embodied in a novel data journaling method and system in which indissociable data areas in a non-volatile memory of an electronic component are backed up to a backup memory in manner such that upon initialization of the electronic device the backup memory may be queried to determine whether updates to the indissociable data areas occurred successfully. If the query of the backup memory indicates that the data areas were not successfully updated, according the invention the correctness of the backup memory is verified, and if verified the indissociable data areas are transferred from the backup memory to the non-volatile memory.

FIG. 1 shows diagrammatically the memory areas of an electronic component in, for example, an electronic purse used to carry out financial transactions with a terminal designed for this purpose. In this case, the electronic component is an integrated circuit card generally known as a smart-card.

The electronic component includes an EEPROM rewritable memory, which could equally well be an EPROM flash memory, in which two data areas Z1 and Z2, likely to be modified during the operation carried out by the electronic component, must be written in a secured way. A data area Zn includes one or several data items and is located at an initial address ADRn in the EEPROM rewritable memory. The latter is divided into memory areas called EEPROM pages. A data area may be in one or two memory pages. Note that when data overlapping two pages is modified, two writes must be made in memory, one for each memory page.

For a financial transaction, the first data area Z1 includes, for example, the amount of the transaction, the second data area Z2 contains the number of the transaction made.

In a customisation phase of the smartcard, i.e. before an utilisation phase, a backup memory M of data areas Zn (n>=1) is defined, including:
   first means of reference M1n of data areas Zn to be secured,
   second means M2n of backing up information on the said data areas Zn.

The backup memory M is a non volatile rewritable memory. Preferably, the backup memory M includes at least one cyclic redundancy check character CRCn associated with each secured data area Zn and the second backup means M2n include an initial address ADRn and a length Ln associated with each data area.

The component also includes a RAM volatile memory. The said RAM memory is used as a buffer memory.

In an utilisation phase of the card, for each secured write required, for example in order to modify the value of the transaction amount, the data areas to be secured are prepared in the RAM buffer memory as follows:

In a first step E1, in the RAM volatile memory, the first area Z1 is referenced, for example with a number. The value one is assigned to this number. Information concerning the said first memory area Z1 is transferred into this RAM buffer memory, such as its initial address ADR1 and its length L1, as well as the said first data area Z1. In addition, a cyclic redundancy check character CRC1 is calculated on all the previous data using a cyclic redundancy check algorithm, the cyclic redundancy check character CRC1 also being stored in the buffer memory.

In a second step E2, the entire content of the RAM buffer memory is written in the backup memory M. This is done in a single written operation. Thus, the number of the first area Z1 is transferred in the first means of reference M11, the address ADR1, the length L1 and the cyclic redundancy check character CRC1 in the second means of information backup M21, and lastly the data of data area Z1.

Preferably, the backup memory M starts at the boundary of a page of the EEPROM rewritable memory and therefore does not overlap two pages. In this case, through this system and the first means of reference, only one write is necessary in the backup memory M for all data areas Zn to be secured. This therefore avoids having to make two or more writes in EEPROM rewritable memory when writing in the said backup memory M.

In a third step E3, the new value V1 of the transaction amount of the first area Z1 is written in the first EEPROM rewritable memory at its initial address ADR1.

The first, second and third step E1, E2 and E3 are repeated as many times as necessary to secure other data areas which will be indissociable from the first area Z1. The same procedure is carried out with the second data area Z2, as shown on FIG. 1. A data area is indissociable from another area if its data is associated, i.e. dependent on the data in the other area. For example, the number of a transaction carried out is associated with the amount of this transaction. Note that indissociable data areas are not necessarily consecutive in the EEPROM rewritable memory.

If the writes of the first data area Z1 and its associated data areas occurred successfully, the backup memory M is disabled by disabling the first definition means M11 of the first data area Z1, by setting the number to zero for example.

Figure 2:
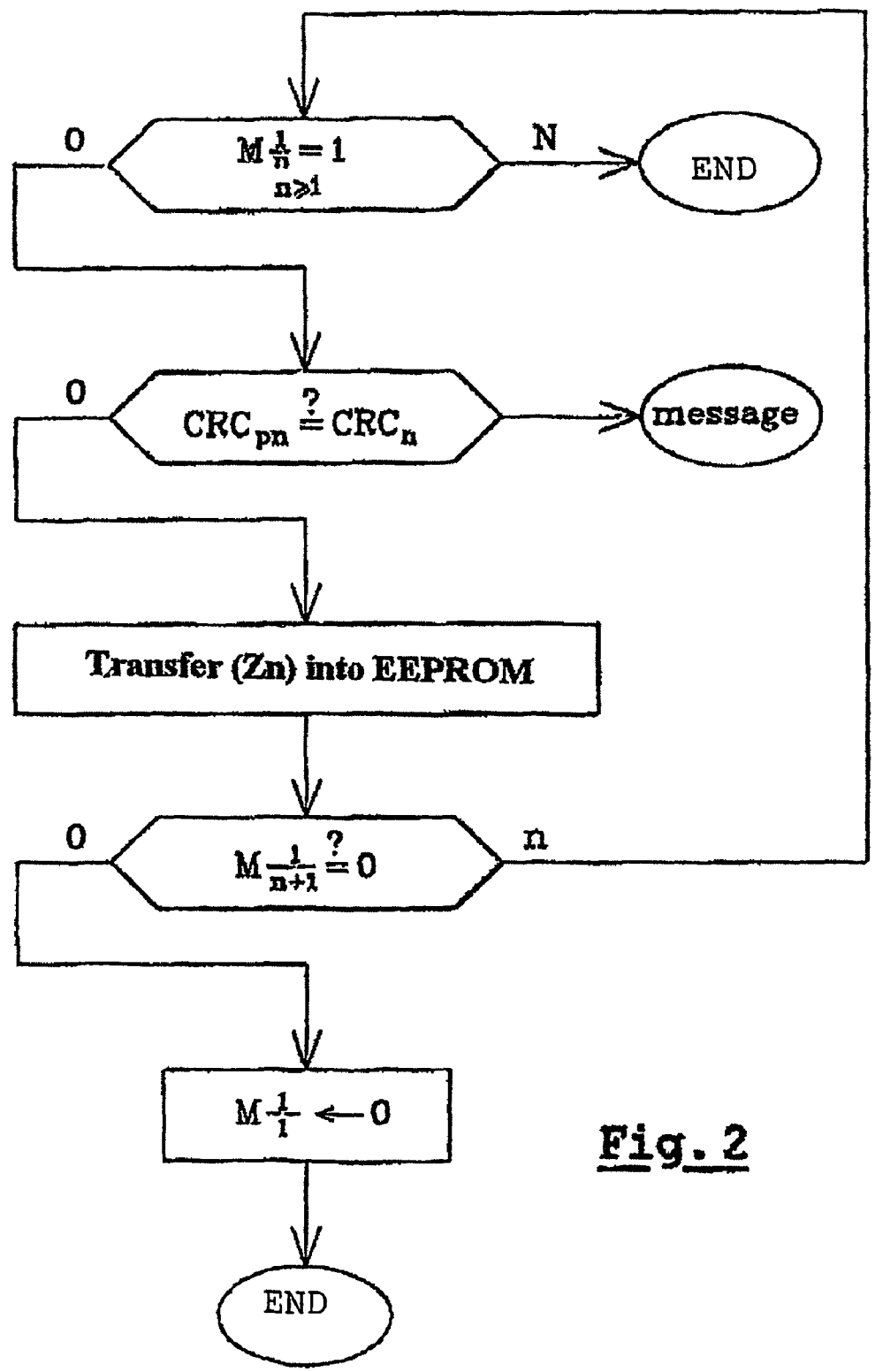
FIG. 2 is a flowchart representing the main steps of the method according to the invention.

Each time the smartcard is initialised, the following steps are carried out, as shown on FIG. 2:
   check the first means of reference M1n, n=1 of the first data area Zn. If they are disabled, either the write of the data areas to be modified occurred successfully or there are no more data areas to be retrieved. Otherwise, there has been a power failure indicating a possible fraud, and the data areas which could have been lost must be retrieved.
   if the check is positive, i.e. when the means of reference M1n are not disabled, a cyclic redundancy check character CRCpn is calculated on the first means of reference M1n and on the second means of information backup M2n associated with the said data area Zn,
   compare the cyclic redundancy check character CRCpn calculated with the cyclic redundancy check character CRCn in the second means of information backup M21,
   if the values are equal, then transfer the first data area Z1 from the backup memory M into the EEPROM rewritable memory, at the initial address ADR1 which is written in the second means of information backup M21. Otherwise, the backup memory M has been damaged. Thus, if the values are different, either the board is disabled by making it "mute": it can no longer be used, or an error message is given.

Repeat the steps described previously during the initialisation phase with the next data area Zn+1, i.e. in our example with the second data area Z2, etc. up to the end of the data areas Zn stored in the backup memory M. The end of the data areas is defined when the $(n+1)^{th}$ first means of definition M1(n+1) is disabled, i.e. when the value is zero or FF in hexadecimal for example.

When all data areas Zn have been retrieved by transferring them from the backup memory M into the EEPROM rewritable memory, the backup memory M is disabled by disabling the first means of definition M11 of the first data area Z1.

Thus, the data areas are secured, there is no loss of data and through the use of the invention, a set of indissociable data areas is retrieved. The set of indissociable data areas is retrieved via in particular the second means of backing up information of the data areas. Said second means of backing up information containing namely in particular the corresponding data area to be retrieved. The coherence of the data areas stored in the EEPROM rewritable memory is therefore guaranteed.

According to an other advantage of the present invention, the number of writes in EEPROM rewritable memory is reduced via in particular the first means of reference of the data areas. Said first means of reference enabling in particular to gather both the data area to be updated and the corresponding related data in a volatile memory, before copying them in the non volatile backup memory in a single copying step. Firstly, the lifetime of the rewritable memory is increased. Secondly the performance of the integrated circuit card is increased by reducing the global time to write in EEPROM rewritable memory.

The invention claimed is:

1. A method for updating together a plurality of data areas contained in a non-volatile memory of a single electronic component, the electronic component also including a volatile memory and a non-volatile backup memory comprising for each data area:
   first means for referencing data;
   second means for backing up information related to the data; wherein the method includes the following steps:
   a referencing step in which a reference is attributed to a data area in the volatile memory;
   a first copying step in which the data area and information related to the data used to characterize the data area are copied from the non-volatile memory to the volatile memory;
   a second copying step in which the entire content of the volatile backup memory is copied into the non-volatile backup memory;
   an updating step in which the content of the data area stored in the non-volatile memory of the electronic component is updated;
   if there is an other data area to update together, return to the referencing step in which a next data area is referenced;
   if there is no other data area to be updated together, the non-volatile backup memory is disabled.

2. The method according to claim 1, wherein the second copying step comprising the sub steps of:
   copying a reference of the data area in the first means of the non-volatile back up memory;
   copying the information related to the data used to characterize the data area in the second means.

3. The method according to claim 1, wherein the backup non-volatile memory is disabled by disabling the first means of one data area.

4. The method according to claim 1, wherein the backup non-volatile memory is disabled by disabling the first means of the first data area.

5. The method according to claim 1, wherein the structure of the non-volatile backup memory area is defined in such a manner that the non-volatile backup memory starts at the beginning of a page.

6. A method for backing up at least one data area contained in a non-volatile memory of a single electronic component, the electronic component comprising a volatile memory and a non-volatile backup memory, wherein the method includes the following steps:
   a first copying step in which the data area and information related to the data used to characterize the data area are copied from the non-volatile memory to the volatile memory, the data area and related data used to characterise the data area constituting the entire content of the volatile backup memory;
   a second copying step in which the entire content of the volatile backup memory is copied into the non-volatile backup memory.

7. The method according to claim 6, wherein a calculating step is inserted between the first and second copying step, the calculating step in which an integrity data is calculated considering the data area and the information related to the data used to characterize the data area, the integrity data being considered as a new information related to the data.

8. The method according to claim 6, wherein the second copying step comprises the sub steps of:
   copying a reference of the data area in a first mean of for referencing the data of the non-volatile back up memory;
   copying the information related to the data used to characterize the data area in a second means for backing up information.

9. Integrated circuit comprising:
   a non-volatile memory including data areas for storing data;
   a volatile memory;
   a non-volatile backup memory for backing up the content of the volatile memory; and
   processing means including instruction for:
      (a) referencing data in the volatile memory;
      (b) copying data and information related to the data area into the volatile memory;
      (c) copying the content of the volatile memory into the non-volatile backup memory;
      (d) updating the data of the non-volatile memory;
      (e) restoring the data of the non-volatile memory with the data of the non-volatile backup memory if an updating has failed.

10. Operating system program for an integrated circuit having a non-volatile memory including data areas for storing data, a volatile memory, a non-volatile backup memory for backing up the content of the volatile memory, and processing means, wherein said operating system program comprises instructions for:
   (a) referencing data in the volatile memory;
   (b) copying data and information related to the data area into the volatile memory;
   (c) copying the content of the volatile memory into the non-volatile backup memory;
   (d) updating the data of the non-volatile memory;
   (e) restoring the data of the non-volatile memory with the data of the non-volatile backup memory if an updating has failed.

* * * * *